United States Patent [19]

Brown

[11] 4,087,796
[45] May 2, 1978

[54] ANALOG-TO-DIGITAL CONVERSION APPARATUS

[75] Inventor: James L. Brown, Toddville, Iowa

[73] Assignee: Rockwell International Corporation, El Segundo, Calif.

[21] Appl. No.: 734,492

[22] Filed: Oct. 21, 1976

[51] Int. Cl.² ............... F03K 13/00; G01R 17/06
[52] U.S. Cl. ....................... 340/187; 340/347 AD; 324/99 D
[58] Field of Search ......... 340/187, 347 AD, 347 CC; 235/92 MP, 151.1, 151.31; 324/99 D

[56] References Cited

U.S. PATENT DOCUMENTS

| | | | |
|---|---|---|---|
| 2,784,396 | 3/1957 | Kaiser et al. | 324/99 D |
| 3,548,169 | 12/1970 | Togneri | 235/92 MP |
| 3,882,488 | 5/1975 | Kosakowski et al. | 324/99 D |
| 3,982,240 | 9/1976 | Waehner | 324/99 D |
| 3,999,123 | 12/1976 | Thoener | 324/99 D |

Primary Examiner—Donald J. Yusko
Attorney, Agent, or Firm—Richard A. Bachand; H. Fredrick Hamann

[57] ABSTRACT

An analog-to-digital converter utilizing a pulse density concept wherein a pulse generator is used and the rate of generation of pulses is a function of the difference between the analog input and the indicated digital output. The pulses are utilized in an adding/accumulation circuit for adjusting the output value upwardly or downwardly to minimize the error input. A digital-to-analog converter is used between the output of the accumulator and an algebraic summing network in a feedback manner to compare with the analog input and produce the error signal.

3 Claims, 4 Drawing Figures

ANALOG-TO-DIGITAL CONVERSION APPARATUS

THE INVENTION

The present invention is generally related to electronics and more specifically to A/D (Analog-to-Digial) converters.

While it is realized that there are many types of A/D converters already in the prior art, it is believed that none of the prior art A/D converters can obtain the accuracy of the presently designed digital unit over a wide temperature range with as few parts as required for the present invention.

One embodiment of the invention using 16 bit (Least Significant Bit [LSB] first) serially generated words was accurate to 13 bits over a temperature range of −34° C to +70° C. The A/D converter illustrated in FIG. 1 shows a device using a variable scale generator. Although the preferred embodiment utilizes the variable scale generator, the device will provide a conversion which is satisfactory for many purposes without the added features obtainable with the variable scale generator. In its basic form, a pulse density conversion is provided wherein the rate of generation of pulses is directly related to an error signal obtained by comparing an analog input with an analog feedback signal. The generated pulses are used in an algebraic adder to add a given input number to an accumulated result which accumulated result is a binary digital number. A D/A (Digital-to-Analog) converter is then used in a feedback manner to convert the digital output word to an analog word which is compared with the analog input for producing the previously mentioned error signal. Although the basic embodiment is similar in complexity to a voltage to frequency conversion using a counter at the output instead of the adder illustrated, the present concept is faster, has a current answer and includes the digital computation in the converter servo loop. Even though the present circuit is faster than one using a counter, it is still somewhat slow as compared to much more complex, but high speed, versions. In one basic embodiment of this concept, the conversion time for a maximum input signal was approximately 20 to 25 seconds using a 320 kHz clock frequency. By adding the variable scale generator as illustrated to provide an improved and preferred embodiment, this conversion time for the same input as described above is reduced from 20 to 25 seconds to less than one second. The variable scaling generator reduces the tracking error or the error between the actual digital output versus the correct digital output for a varying analog input. In effect, this variable scaling raises the basic voltage to frequency sensitivity by whatever factor occurs as the scale output of the variable scale generator.

As will be apparent from the subsequent description, variable scaling is based on a principle that the time for an integrator to integrate from a known voltage value after reset to a known voltage threshold is linearly related to the value of the analog current input to the integrator. The analog current input to the integrator is the result of substacting the pulse density times a reference voltage from the converter analog input. In implementing the variable scale generator, a counter is loaded with a digital word (this word comprises the maximum desired scale) at integrator reset time and a least significant bit is subtracted from each word time that passes without the integrator output reaching the voltage threshold. This counted down variable scale number is used for the scale number supplied to the R adder or algebraic adder of the inventive concept when the integrator output reaches voltgage threshold. At the same time the counter is reloaded with maximum scale and the countdown process is restarted. In the event that the integrator output does not reach the voltage threshold when the counter content is reduced to a LSB scale value, the countdown process is stopped after this value is decoded and the LSB number is used for further inputs to the serial adder.

From the above, it may be determined that with variable scaling the digital increment required by the converter for final value setting of the digital output is predicted and added as opposed to the continuous use of a given unvariable increment of the basic inventive concept.

As may be ascertained from the above, the adding of a new scale word to the accumulated result occurs each time the variable threshold is reached and thus the charge removed from the integrator must be regained between each output pulse for a given added increment to the accumulator. However, with variable scaling only one reset charge must be overcome to allow another variable scale increment which may be much larger than the previous increment. Conversion time is therefore reduced with variable scaling but in the end result the countdown process still allows a LSB resolution or adder increment. As will be realized, the integration output must be set at a value such that it will not reach the threshold before the new pulse density feedback signal reaches its final value after being incremented by one LSB.

In view of the above, it is an object of the present invention to provide an improved analog-to-digital converter.

Other objects and advantages of the present invention may be ascertained from a reading of the specification and appended claims in conjunction with the drawings wherein:

DETAILED DESCRIPTION

Figure 1:
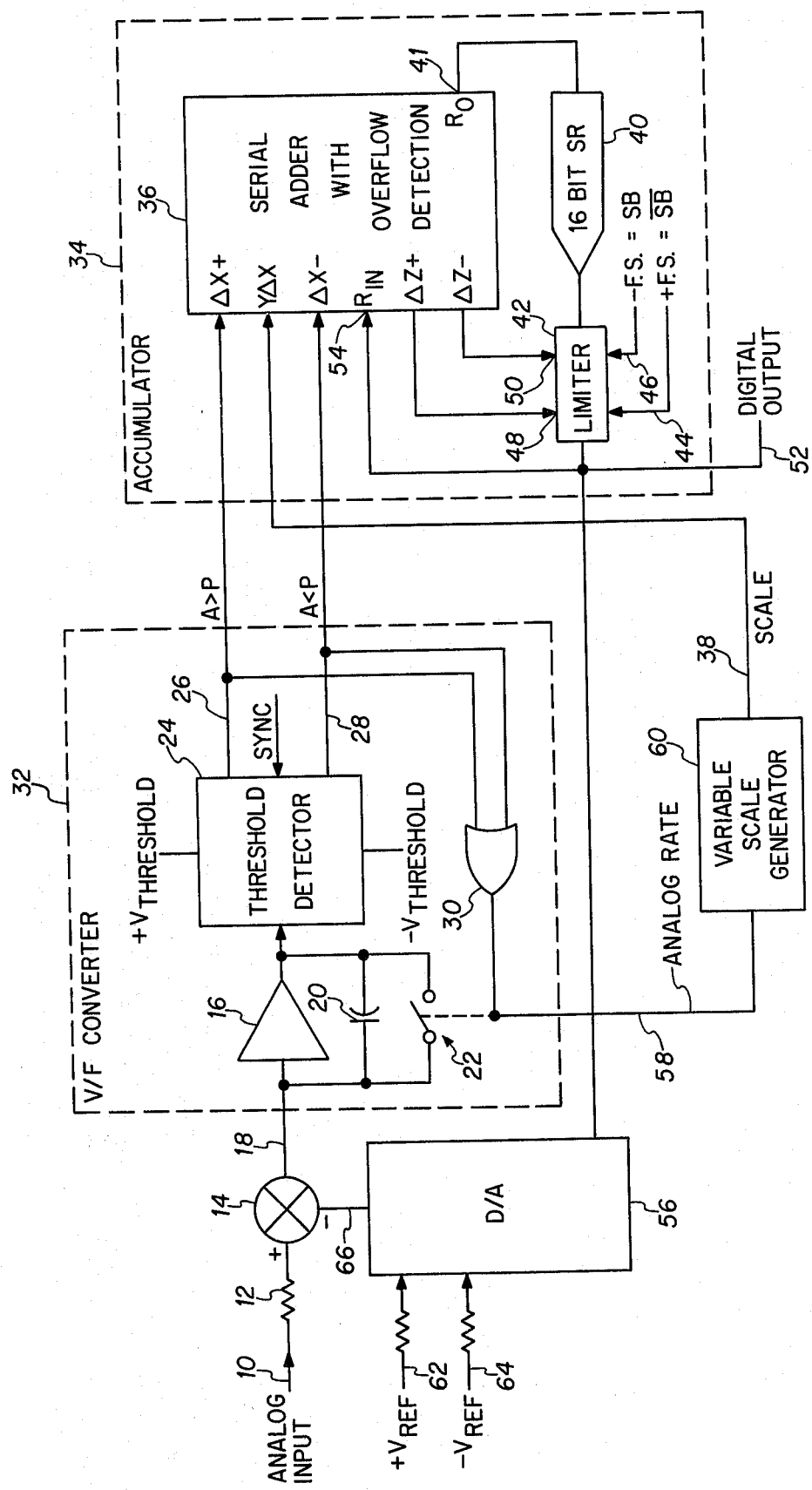
FIG. 1 is a block schematic diagram of a preferred embodiment of the inventive concept.

In FIG. 1, an analog input 10 is supplied through a summing resistor 12 to the input of an algebraic summing means 14 whose output is connected to an operational amplifier 16 by a lead 18. An integrator capacitor 20 from output to input of amplifier 16 provides an integrating function. A switch generally designated as 22 is connected in parallel with capacitor 20. An output of amplifier 16 is supplied to a threshold detector 24 having outputs 26 and 28 which supply signals to an OR gate 30 for controlling switch 22. As will be noted, the components from 20 to 30 as well as amplifier 16 are contained in a block 32 labeled "V/F Converter" (voltage to frequency converter) and are shown and described in more detail in my copendng application Ser. No. 734,689, filed Oct. 21, 1976, assigned to the same assignee as the present invention. The lines 26 and 28 are also supplied to an accumulator block 34 containing an adder 36 and are connected to the ΔX+ and ΔX− inputs of adder 36. A scale input lead 38 is also connected to accumulator 34 and is supplied to the YΔX input of adder 36. A shift register 40 is connected from an $R_o$ output 41 of adder 36 to the input of a limiter 42 having full scale plus and minus inputs 44 and 46, respectively, as well as ΔZ+ and ΔZ− inputs 48 and 50 from the adder 36. An output of limiter 42 is supplied on a digital output line 52 and is also fed back to an $R_{in}$ input 54 of adder 36 as well as being supplied to a D/A converter 56. In the above reference integrating apparatus application, the converter 32 and the accumulator 34 comprise an analog-to-digital integrator which is useful in and of itself and is incorporated in this application by reference. Further details as to the operation may be obtained from the referenced patent application. As illustrated herein, the lead controlling switch 22 is labeled analog rate and is given a designation 58. The lead 58 provides an input to a variable scale generator 60 whose output is connected to lead 38.

The D/A converter 56 has plus and minus voltage reference leads 62 and 64 and provides an analog output on lead 66 to the summing circuit 14 in a different manner so that the signal on lead 66 is subtracted from the lead supplied through resistor 12. The D/A converter 56 may be any of several types and may advantageously be constructed in accordance with the teachings of my copendng patent application Ser. No. 715,775, filed Aug. 19, 1976, assigned to the same assignee as the present invention. Since a detailed understanding of a specific type of D/A converter is not a requirement to understanding the present inventive concept, the reader is referred to the referenced patent application for further background information if such is required.

Figure 2:
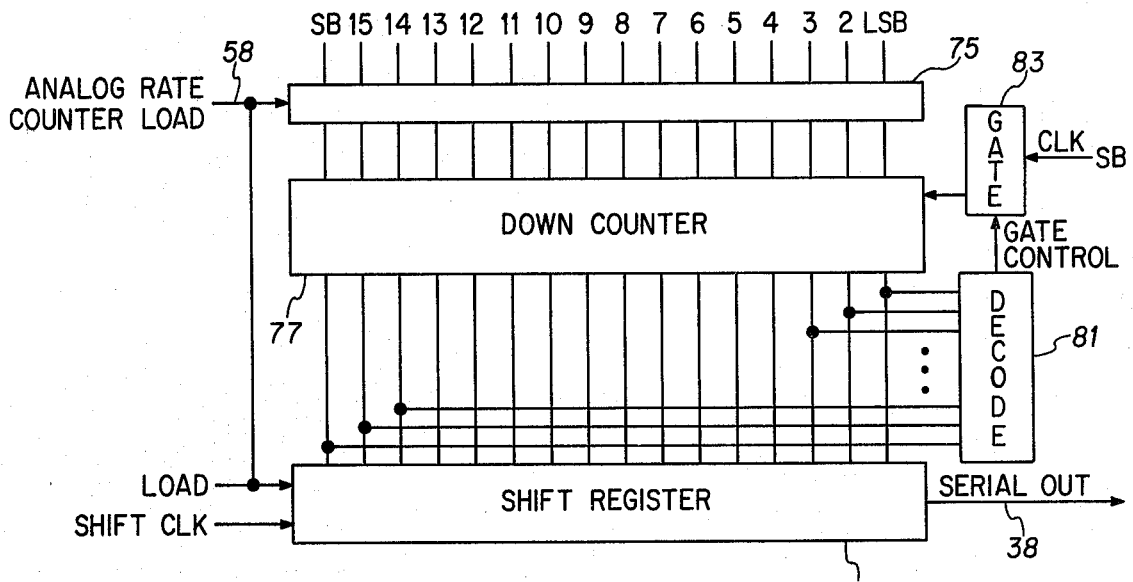
FIG. 2 is a generalized block diagram of the variable scale generator portion of FIG. 1.

In FIG. 2, a diagram is illustrated using as a basis that the words used in the inventive concept are 16 bit words genrated LSB first. A parallel output register 75 contains a maximum scale word which in one embodiment was the binary digital equivalent of −323. Whenever a pulse is received on line 58 the word is passed from register set of transfer gates or buffer 75 to a down counter 77 (which counts from a scale of −323 toward zero) while simultaneously loading the count obtained on the previous down count from down counter 77 into a further shift register 79. Shift register 79 is a parallel in-serial out shift register providing its output signal on 38. The 16 parallel output bits of down counter 77 are decoded by a content decoder 81 which upon decoding a particular binary number actuates a counter clock gate 83 to stop the operation of down counter 77. As designed, the decoded number is a minus least significant bit number which in binary number fashion comprises a number having all 1's. (Note: the number in FIG. 2 is 1 binary digit different from that of following FIG. 3.)

Figure 3:
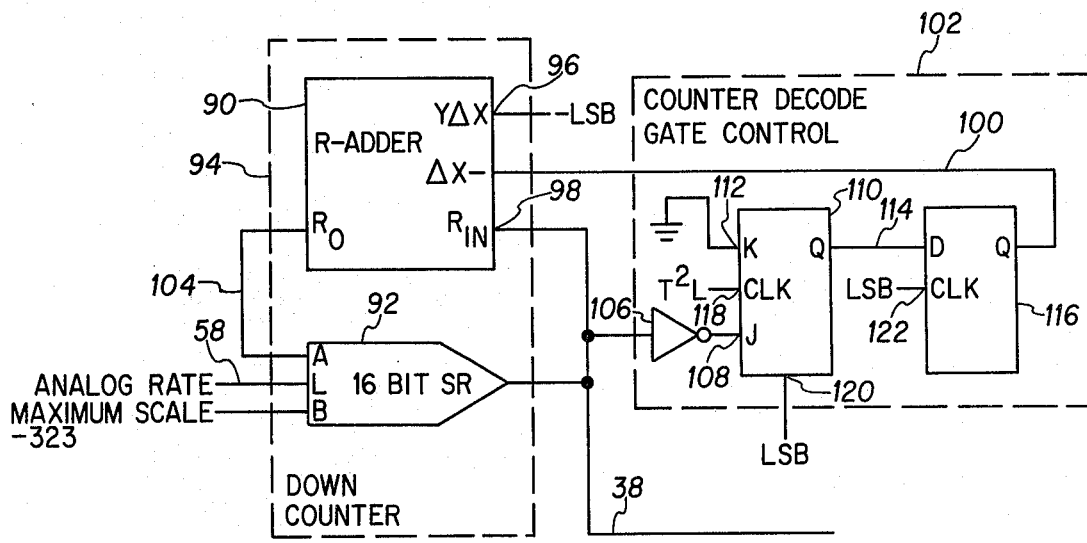
FIG. 3 is a detailed schematic diagram of one set of circuit apparatus for implementing the cncept of FIG. 2.

FIG. 3 accomplishes the same result as does FIG. 2 but accomplishes it in a different and somewhat novel fashion. FIG. 2 is somewhat conventional and an easy concept to understand for the idea of converting the rate of occurrence of a set of input pulses into a binary digital output word which is directly representative of that rate by effectively counting the time between occurrence of input pulses.

FIG. 3 is somewhat different in that it uses an R adder 90 and a shift register 92 within a down counter block 94. The maximum scale number is loaded into shift register 92 when an incoming signal is received on analog rate line 58. The R adder acts to subtract a negative least significant bit on lead 96 to the minus number output of shift register 92 as applied to input 98. (This effectively results in an addition.) The input on a lead 100 from a counter decode and gate control block 102 is normally logic 1. This input is to a subtract input and thus a negative number is subtracted from a negative number which effectively results in decrementing the absolute value by changing the incoming number on lead 98 to a number which is closer to 0. This number is output on lead 104 and returned to the shift register 92 for further circulation. The down counter 94 is acting in an accumulator fashion similar to block 34 of FIG. 1 without the limiting function. The signal appearing on scale output lead 38 is continuously changing as the counter is counting down but as will be determined later this changing number does not adversely affect the operation of the circuit. The unique section of FIG. 3 is the counter decode. As will be noted, the signal on lead 38 is inverted by an inverter 106 before being applied to a J input 108 of the JK flip-flop 110. The K input 112 of JK flip-flop 110 is connected to ground or reference potential while its Q output is supplied on a lead 114 to a D flip-flop 116. The flip-flop 110 has a T²L signal supplied to a clock input 118 the timing of which is illustrated in the timing diagram of FIG. 4. A reset input 120 contains a LSB serially applied word which is the complement of the word applied to input 108 and which will one word time later actuate the flip-flop 116 such that the output on 100 is altered to a logic 0 and the down counter 94 in the form of R adder 90 no longer changes the number in shift register 92. A clock input 122 for D flip-flop 116 also receives a LSB serially applied word.

Figure 4:
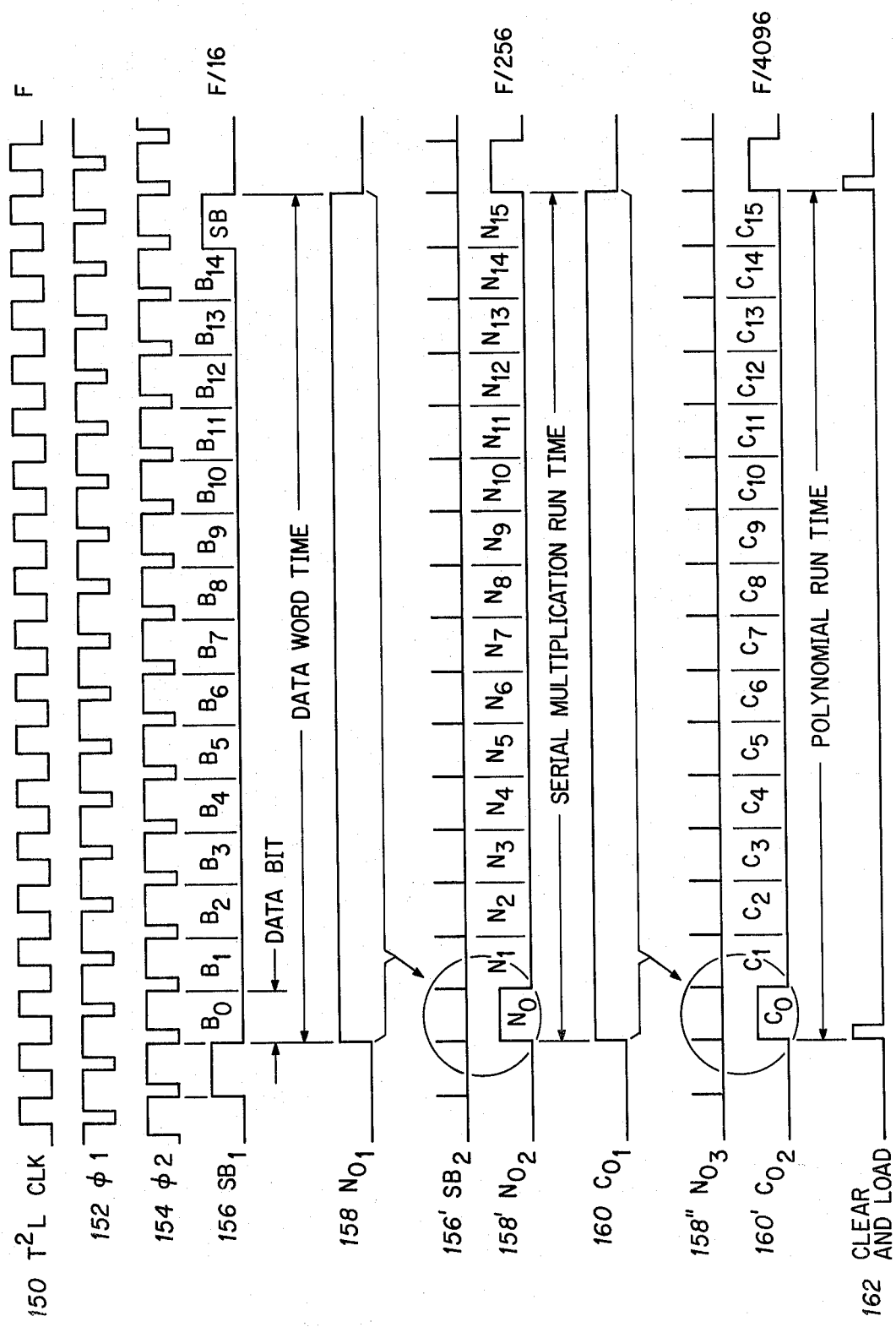
FIG. 4 is a timing diagram for use in understanding the invention.

FIG. 4 comprises a plurality of waveforms showing the interrelationship of the basic frequency waveform 150 which is used to generate phase 1 and phase 2 clocks 152 and 154, respectively. Although waveforms 152 and 154 are not shown specifically in the schematic diagrams, the two different phases are used to overcome timing problems between various logic gates. A sign bit or sync bit shown as waveform 156 occurs every 16 pulses of the basic frequency 150. The time between sign bit pulses is designated as waveform 158 and is a complete data word time. As will be noted, there are 16 data bits per data word and the time for one addition pass through R adder 90 to occur is the time for one data word to pass through the unit and corresponds to the time between sync bit pulses. The sync bit is also presented as waveform 156′ along with the data word $N_o$ waveform 158′ on a scale of frequency/256 so as to illustrate waveform 160 which covers a time frame of 16 data words and is the time necessary for a series of multiplications to occur in a device for multiplying one word times a second word. Such a multiplication is required in apparatus such as may be found in U.S. Pat. No. 3,829,672 issued Aug. 13, 1974 and pertaining to the solving of square roots.

It may be noted at this point that a waveform similar to 156 except that the pulse occurs during time $B_o$ is representative of the digital word LSB.

The third set of waveforms includes 158″, 160′ and the clear and load waveform 162. The time between clear and load pulses 162 is equivalent to the polynomial run time of a series of data word multiplications and is at a frequency of F/4096.

If the present device is to be used in a system which requires a plurality of data word multiplications to obtain a computational result such as a polynomial solver as illustrated in U.S. Pat. No. 3,962,573 issued June 8, 1976, the waveforms 160 as well as 162 play a part in circuit operation. However, these waveforms are not used herein as presented and are illustrated merely for completeness of disclosure as pertains to the present inventive concept.

OPERATION

Although probably apparent in view of the above material, an explanation of the operation of this circuit will be provided. Basically, blocks 32 and 34 provide the function of A/D integrator while block 56 provides a function of a D/A converter. If an input signal is applied on 10, there will initially be no output from D/A converter 56 and thus the entire output will appear on lead 18 as an error or difference between the input 10 and the input from 66. The integrator comprising blocks 32 and 34 will commence changing the digital output on 52 to be representative of that on 10 and the D/A converter will convert this back to an analog signal which opposes the signal from lead 10 so as to reduce the error signal appearing on 18. Theoretically, when the output 52 is directly representative of the analog input, the signal on lead 66 will exactly counterbalance the signal amplitude on lead 10 and the device will stop further integrating action.

The above discussion, of course, did not take into account directly the action of scale generator 60. As previously mentioned, the scale generator 60 is not required to provide accurate operation. Rather, it increases the rate of tracking and thus produces an output answer much quicker. In operation, the generator 60 effectively determines the amplitude of the error signal on 18 and adjusts the action of the accumulator 34 so as to accumulate numbers faster when the error signal on lead 18 is larger. This is accomplished by changing the magnitude of the scale number on lead 38 so that the adder 36 adds a bigger number to the accumulated result in shift register 40 during these times. As the difference or error signal on 18 reduces in amplitude, the scale number on lead 38 is also reduced in amplitude and thus the rate of change of output for the accumulator 34 is reduced.

Although explained in much more detail in the referenced patent application Ser. No. 734,689, the voltage to frequency converter 32 uses an integrator which upon integrating to a given threshold value will trip the threshold detector 24 and provide an output pulse to reduce the charge on integrator capacitor 20 by a set amount through the action of switch 22 as well as to actuate adder 36 to add whatever number appears on scale lead 38 to the accumulated result presently appearing in shift register 40 as it is received at input 54. The input on 54 is also the output on lead 52.

As mentioned above, the output number on scale lead 38 may continuously change if the embodiment of FIG. 3 is used for the generator 60. This does not affect operation adversely since the only time that adder 36 reacts to the number appearing on lead 38 is when a control signal is received on either of leads 26 or 28. Thus, the scale number is received by block 36 at the time that the correct number appears on lead 38 indicative of the analog rate of the integrator within converter 32 and is synchronized by the SB pulses of waveform 156 to commence at the beginning of a data word.

upon receipt of an analog rate pulse, one word wide (long), at the shift register 92 (load input 58), a scale word of −323 (chosen for design considerations) is loaded at input B. This 2's complement word is 16 bits long, LSB first:

10111101011111111

The purpose of the variable scaling circuit is to subtract a −LSB word each word frame of time and stop with a −LSB word circulating in adder 90 and shift register 92. To monitor and stop the countdown process, JK flip-flop 110 and D flip-flop 116 are used. The countdown is in an organized pattern which will always contain a zero except for the case of the stop word −LSB which is all "ones". It is only necessary to check each word for the presence of a zero and once a word which contains all "ones" (−LSB) is in the shift register the countdown process is stopped. The shift register output on lead 38 is monitored each word time for the presence of a logic zero in the circulating word. However, since a subtraction of a −LSB is in process, the word −2LSB must be detected (i.e. 0111111111111111). The countdown process is then stopped with the result of the last subtraction. The shift register then circulates −LSB through the adder with no further change because the input 100 (ΔX−) is changed from a logic one to a logic zero. The word −2LSB (0111111111111111) has the zero in LSB position which is ignored by using +LSB (1000000000000000) as reset for the JK F/F 110 and leaving the JK Q output on 114 at a logic zero. (Note: A JK F/F with K = 0 can only change the Q output to a logic 1 when J = 1 on the rising edge of a clock. J returning to a zero and subsequent clocking will not change Q from a logic 1 level.) By including the inverter 106 between the J input 108 and shift register output, the absence of logic zeros in the countdown word is detected, and the countdown process is stopped the following word time. The D F/F 116 detects the JK F/F output on 114 and provides a one word wide (the width of an "N" pulse) ΔX− subtract or not subtract command to the adder 90 for the following word time.

Although a particular number was discussed as being detected by decode 102, it will be realized that some other numbers can be detected by changing the makeup of the complementary word applied to reset input 120 to maintain the output of the JK flip-flop in a logic 0 condition for an entire word time. Other numbers may require alteration of circuit components and logic approach as will be obvious to one skilled in the art. (I.e., to detect +LSB, the input 118 would need to be $\phi_1$ instead of T²L and also the J input would be connected directly to 104 while input 96 would receive +LSB rather than −LSB.)

While the present inventive concept has been discussed with regard to a specific preferred embodiment, it is to be realized that the inventive concept may be practiced by those skilled in the art using other components and techniques and thus I wish to be limited only by the scope of the appended claims.

What is claimed is:

1. Analog-to-digital conversion means comprising, in combination:
    analog-to-digital integrating means, including analog input and serial binary digital word output means, for providing digital output words indicative of an integrated analog input signal;
    digital-to-analog conversion means, including input and output means, connected to receive digital output words from said output means of said integrating means at said input means of said conversion means, said conversion means providing an analog equivalent error signal at said output means thereof;

means for supplying an analog input signal to be converted;

combining means, connected to receive and algebraically combine said error and input signals, and a variable scale generator responsive to the amplitude of the input signal to add to said digital output words numbers of scale directly related to the amplitude of said input signal to vary the speed at which the error signal approaches the value of the input signal.

2. Analog-to-digital conversion apparatus comprising, in combination:

first means for supplying an analog input signal to be converted to a serial digital binary number output word;

second means, including input and output means, for providing an output signal at said output means indicative of the polarity of a signal supplied to said input means thereof when the integrated value of the input signal exceeds a predetermined threshold while simultaneously reducing the integrated value by a prescribed amount;

accumulator means, including control means and digital word output means, for algebraically and incrementally accumulating binary digital words in accordance with signals received at said control means and outputting the accumulated digital word result as an error signal;

means connecting said output means of said second means to said control means of said accumulator means;

digital-to-analog means, including output means and connected for receiving said error signal from said accumulator means, for converting the error signal to an equivalent analog signal;

algebraic analog signal combining means, connected to said first means, said second means and said digital-to-analog output means, for supplying the algebraic result of the analog input and error signals to said input means of said second means means, connected to said second means, for providing an output indication each time the integrated value is reduced, and variable scale means, connected between said second means and said input means of said accumulator means, for changing the value of incremental accumulation in accordance with the rate of occurrence of input signals received from said second means to control the speed at which the equivalent analog signal approaches the analog input signal.

3. Apparatus as claimed in claim 2 wherein said second means includes:

analog integrator means for integrating incoming signals;

threshold detecting means for providing separate first and second output control signals, indicative respectively of the polarity of said analog input signal to be converted upon each occasion of the integrated signal exceeding a predetermined threshold, and means, reacting to the output control signals of said detecting means, for reducing the charge in said integrator means each time said threshold is exceeded.

* * * * *